(12) United States Patent
Tseng et al.

(10) Patent No.: US 10,163,769 B2
(45) Date of Patent: Dec. 25, 2018

(54) MANUFACTURING METHOD FOR ELECTRONIC ELEMENT

(71) Applicant: Sitronix Technology Corp., Hsinchu County (TW)

(72) Inventors: Kuo-Wei Tseng, Hsinchu County (TW); Po-Chi Chen, Hsinchu County (TW)

(73) Assignee: Sitronix Technology Corp., Hsinchu County (TW)

( * ) Notice: Subject to any disclaimer, the term of this patent is extended or adjusted under 35 U.S.C. 154(b) by 0 days.

(21) Appl. No.: 15/675,783

(22) Filed: Aug. 13, 2017

(65) Prior Publication Data

US 2017/0345784 A1 Nov. 30, 2017

Related U.S. Application Data

(62) Division of application No. 15/190,147, filed on Jun. 22, 2016, now Pat. No. 9,773,746.

(60) Provisional application No. 62/184,910, filed on Jun. 26, 2015.

(51) Int. Cl.
| | |
|---|---|
| *H01L 29/40* | (2006.01) |
| *H01L 23/498* | (2006.01) |
| *H01L 23/00* | (2006.01) |

(52) U.S. Cl.
CPC ........ *H01L 23/49816* (2013.01); *H01L 24/11* (2013.01); *H01L 24/13* (2013.01); *H01L 24/16* (2013.01); *H01L 24/17* (2013.01)

(58) Field of Classification Search
CPC .................. H01L 23/49816; H01L 24/03
USPC .......... 257/738, 772, 781, 736; 438/612–614
See application file for complete search history.

(56) References Cited

U.S. PATENT DOCUMENTS

| | | | |
|---|---|---|---|
| 6,597,069 B1 * | 7/2003 | Degani | H01L 24/11 |
| | | | 257/643 |
| 6,753,609 B2 | 6/2004 | Chien | |
| 7,015,130 B2 | 3/2006 | Tsai | |
| 7,053,490 B1 | 5/2006 | Wang | |
| 7,056,818 B2 | 6/2006 | Yang | |
| 7,205,221 B2 | 4/2007 | Akram | |
| 9,773,746 B2 * | 9/2017 | Tseng | H01L 24/13 |
| | | | 257/772 |
| 2006/0278331 A1 | 12/2006 | Dugas | |
| 2008/0050905 A1 | 2/2008 | Uchida | |

FOREIGN PATENT DOCUMENTS

| | | |
|---|---|---|
| CN | 1437232 A | 8/2003 |
| JP | S61141158 A | 6/1986 |
| JP | H06-177136 A | 6/1994 |
| JP | 2000-124265 A | 4/2000 |
| JP | 2004235420 A | 8/2004 |
| JP | 2007317979 A | 12/2007 |
| JP | 2009231681 A | 10/2009 |
| KR | 1020090106913 A | 10/2009 |

(Continued)

*Primary Examiner* — Calvin Lee
(74) *Attorney, Agent, or Firm* — Winston Hsu

(57) ABSTRACT

The present invention provides a manufacturing method for an electronic element of an electronic apparatus. The electronic element includes a substrate, a bump and at least one under bump metal (UBM) layer. The manufacturing method includes sequentially disposing the UBM layer and the bump onto the substrate; and processing an etching operation at the UBM layer to form a breach structure.

5 Claims, 7 Drawing Sheets

(56) References Cited

FOREIGN PATENT DOCUMENTS

| | | |
|---|---|---|
| TW | 560018 | 11/2003 |
| TW | 200744170 | 12/2007 |

* cited by examiner

MANUFACTURING METHOD FOR ELECTRONIC ELEMENT

CROSS REFERENCE TO RELATED APPLICATIONS

This application is a divisional application of application Ser. No. 15/190,147, which was filed on Jun. 22, 2016, now U.S. Pat. No. 9,773,746 issued Sep. 26, 2017 and claims the benefit of U.S. provisional application No. 62/184,910, the contents of which are incorporated herein by reference.

BACKGROUND OF THE INVENTION

1. Field of the Invention

The present invention relates to an electronic element and a manufacturing method, and more particularly, to an electronic element and a manufacturing method which improves a shear-force resistance.

2. Description of the Prior Art

Conventionally, all types of electronic apparatuses comprises many electronic elements inside to be adaptively disposed for connecting/assembling, so as to comply with different operations of the electronic apparatuses, and a bump is a common conduction material to bridge a driving chip with other peripheral composition elements.

However, the driving chip is approaching smaller layout design, which may result in a requirement for a smaller size of the bump. Accordingly, the smaller size of the bump contributes a smaller contact area and a less attaching capability between the bump and the driving chip. Once an external force is applied to the bump, the bump might easily detach from the driving chip to cause more cost for repairing.

Therefore, it has become an important issue to provide another electronic element and manufacturing method, to correspondingly improve a shear-force resistance of the electronic element under the pursuing of a smaller size of the electronic element/apparatus.

SUMMARY OF THE INVENTION

Therefore, the primary objective of the present invention is to provide a manufacturing method for a structure-improved electronic element, so as to improve a shear-force resistance of the electronic element.

The present invention further discloses a manufacturing method for an electronic element of an electronic apparatus. The electronic element comprises a substrate, a bump and at least one under bump metal (UBM) layer. The manufacturing method comprises sequentially disposing the UBM layer and the substrate onto the substrate; and processing an etching operation at the UBM layer to form a breach structure.

These and other objectives of the present invention will no doubt become obvious to those of ordinary skill in the art after reading the following detailed description of the preferred embodiment that is illustrated in the various figures and drawings.

DETAILED DESCRIPTION

Certain terms are used throughout the following description and claims, which refer to particular components. As one skilled in the art will appreciate, electronic equipment manufacturers may refer to a component by different names. This document does not intend to distinguish between components that differ in name but not in sub-module. In the following description and in the claims, the terms "include" and "comprise" are used in an open-ended fashion, and thus should be interpreted to mean "include, but not limited to . . . ". Also, the term "couple" is intended to mean either an indirect or direct electrical connection. Accordingly, if one device is coupled to another device, that connection may be through a direct electrical connection, or through an indirect electrical connection via other devices and connections.

Considering the prior art which may suffer from an external force to cause the bump easily detach from the driving chip, the embodiment of the invention has a structural improvement on a single or a plurality of under bump metal (UBM) layer(s) between the bump and the driving chip. The following embodiments only depict the representative structure of the bump and the UBM layer(s) for clear demonstration.

Figure 1A:
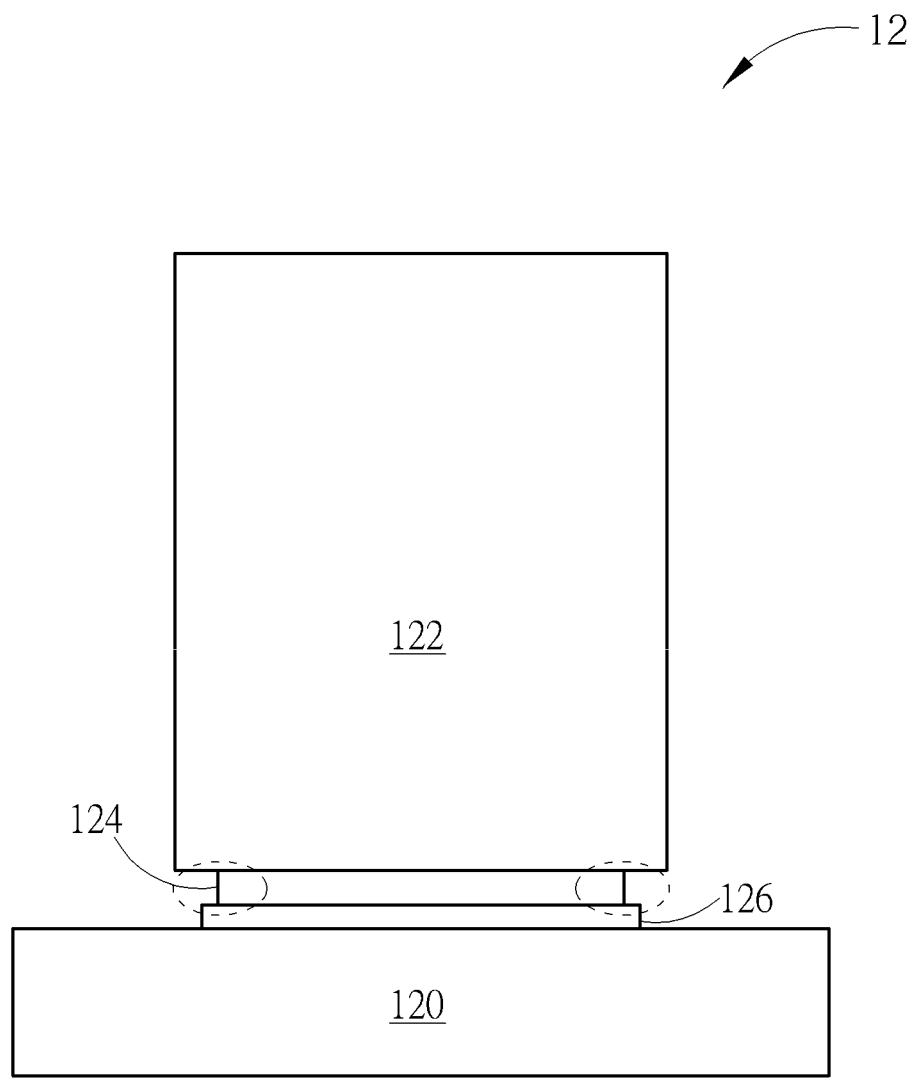
FIG. 1A illustrates a local schematic diagram of an electronic element according to an embodiment of the invention.

Please refer to FIG. 1A, which illustrates a local schematic diagram of an electronic element 12 according to an embodiment of the invention. As shown in FIG. 1A, the electronic element 12 is disposed inside an electronic apparatus, which may be a cellular phone, a tablet device, a wearable electronic device or a laptop, and the electronic element 12 may be a driving chip of the electronic apparatus, which is not limiting the scope of the invention. The electronic element 12 comprises a substrate 120, a bump 122 and UBM layers 124, 126. The substrate 120 may be a circuit board of the driving chip, the bump 122 is disposed on the substrate 120 to electrically connect transmission lines or operational elements/modules of the electronic apparatus, and the UBM layers 124, 126 are sequentially disposed between the bump 122 and the substrate 120, such that the bump 122 is adaptively attached onto the substrate 120. Certainly, in other embodiments, more than two UBM layers may be disposed between the substrate and the bump, which is not limiting the scope of the invention.

Further, the embodiment of the invention is not limiting materials of the bump and the UBM layer; considering costs of the electronic apparatus (element) and conduction efficiency of transmission signals, the embodiment may adaptively select different types of metals/semiconductors to be the material of the bump and the UBM layer. For example, in one embodiment, the bump may be a first material (e.g. gold), and the plurality of UBM layers may be a second material (e.g. brass) and a third material (e.g. silver) to be interlaced between the substrate 120 and the bump 122, i.e. being similar to the structure shown in FIG. 1A, such that the bump 122 and the UBM layers 124, 126 are sequentially stacked to be a metallic bonding body to connect the substrate 120, so as to provide a stronger attachment for the bump stably fixed onto the substrate 120. Certainly, in another embodiment, the bump 122 may be the first material, the UBM layer next to the bump 122 may be the second material and the another UBM layer may be the first material, and accordingly, the embodiment can also form the similar structure shown in FIG. 1A, such that the bump 122 and the UBM layers being stacked as the metallic bonding body may stabilize the bump to be fixed onto the substrate.

Figure 1B:
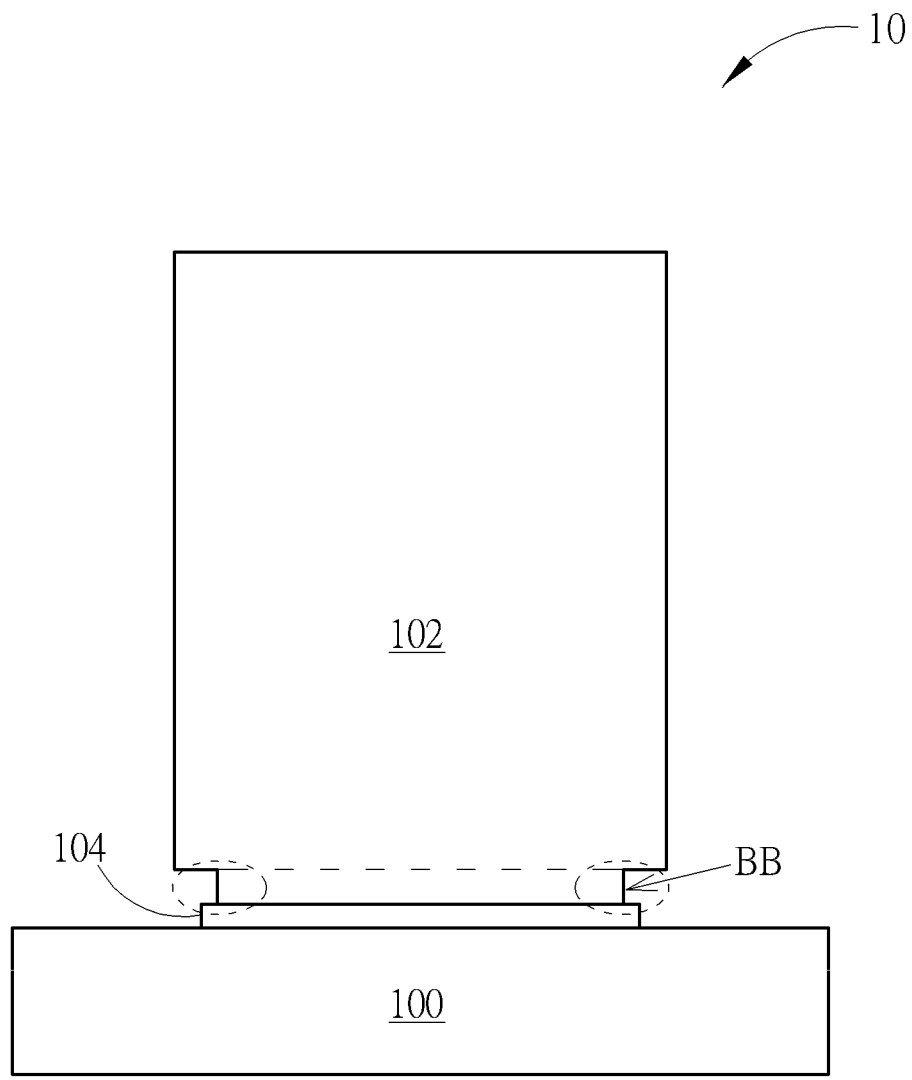
FIG. 1B illustrate a local schematic diagram of another electronic element according to an embodiment of the invention.

Further, in another embodiment, the material of the bump is the first material, the UBM layer next to the bump is also the first material and the another UBM layer is the second material. Since the bump and the adjacent UBM layer are both the first material, it is not easy to tell the difference between the bump and the adjacent UBM layer. Under such circumstances, the adjacent UBM layer may be regarded as a part of the bump, i.e. forming a bump connecting base. Please refer to FIG. 1B, which illustrate a local schematic diagram of another electronic element 10 according to an embodiment of the invention. Being similar to the structure of the electronic element 12 shown in FIG. 1A, the electronic element 10 in FIG. 1B also comprises a substrate 100, a bump 102 and a UBM layer 104, and a bump connecting base BB is disposed between the bump 102 and the UBM layer 104 (i.e. the place pointing by the arrow). Accordingly, the embodiment of the invention also demonstrates a single UBM layer, which is also within the scope of the invention.

Considering requirements of different electronic apparatuses or electronic elements, the embodiment of the invention may adaptively choose the material for the bump and the at least one UBM layer, and the number of the UBM layer disposed between the bump and the substrate may be correspondingly adjusted, so as to facilitate the production of the electronic element.

Please refer to FIG. 1A and FIG. 1B again. The embodiment of the invention is to form a breach structure on the UBM layer next to the bump (or at the bump connecting base), e.g. the circled place shown in FIG. 1A and FIG. 1B, no matter how many the UBM layer is. Preferably, the breach structure of the invention is configured to improve a shear-force resistance between the bump and the substrate, so as to stabilize the connection of the bump and the substrate. Further, the breach structure is not limiting to be formed on the UBM layer next to the bump, and the breach structure forming on the UBM layer next to the bump is the only a preferable embodiment. In comparison with the conventional bump being not easily attached/disposed onto the driving chip, the embodiment of the invention adaptively modifies the structure of the UBM layer next to the bump (or the bump connecting base BB), to correspondingly form the breach structure for significantly improve the shear-force resistance of the bump.

Figure 2:
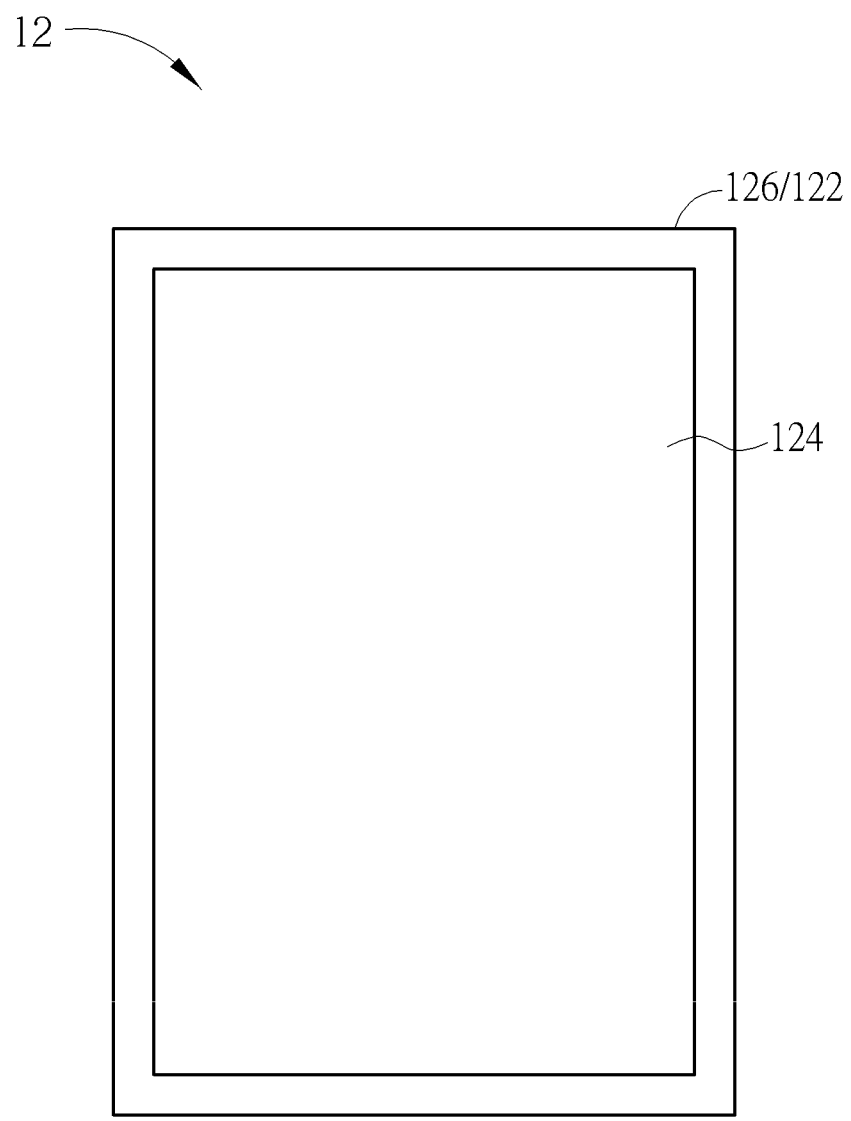
FIG. 2 illustrates a schematic diagram of the electronic element shown in FIG. 1A from a vertical view.

Please refer to FIG. 2, which illustrates a schematic diagram of an electronic element 12 shown in FIG. 1A from a vertical view. As shown in FIG. 2, the breach structure of the embodiment is formed on a plane where the bump 122 attaches onto the UBM layer 124, i.e. the breach structure is disposed on the UBM layer 124 directly connecting to the bump 122. Preferably, from the vertical view, the bump 122 is projected to a plane to form a first cross area, the UBM layer 124 is projected to the plane to form a second cross area, and the UBM layer 126 is projected to the plane to form a third cross area. Under such circumstances, the first cross area of the bump 122 is larger than the second cross area of the UBM layer 124, and the third cross area of the UBM layer 126 is larger than the second cross area of the UBM layer 124. Accordingly, the cross area projected by the UBM layer 124 is the smallest, and the cross area of the bump 122 (or the UBM layer 126) is larger than the cross area of the UBM layer 124, such that the cross area projected by the UBM layer 124 is entirely covered/overlapped/surrounded by the cross area projected by the bump 122 (or the UBM layer 126). From a one-dimension viewpoint, the first cross area of the bump 122 comprises a first length and a first width, the second cross area of the UBM layer 124 comprises a second length and a second width, and the third cross area of the UBM layer 126 comprises a third length and a third width. Under such circumstances, the second length of the UBM layer 124 is smaller than the first length of the bump 122 (or the third length of the UBM layer 126), and the second width of the UBM layer 124 is smaller than the first width of the bump 122 (or the third width of the UBM layer 126). For the comparison of the cross areas projected by the bump 122 and the UBM layer 126 (or the length/width corresponding to the cross areas projected by the bump 122 and the UBM layer 126), the embodiment of the invention spares some adjustments according to different requirements, which is not limiting the scope of the invention.

Figure 3A:
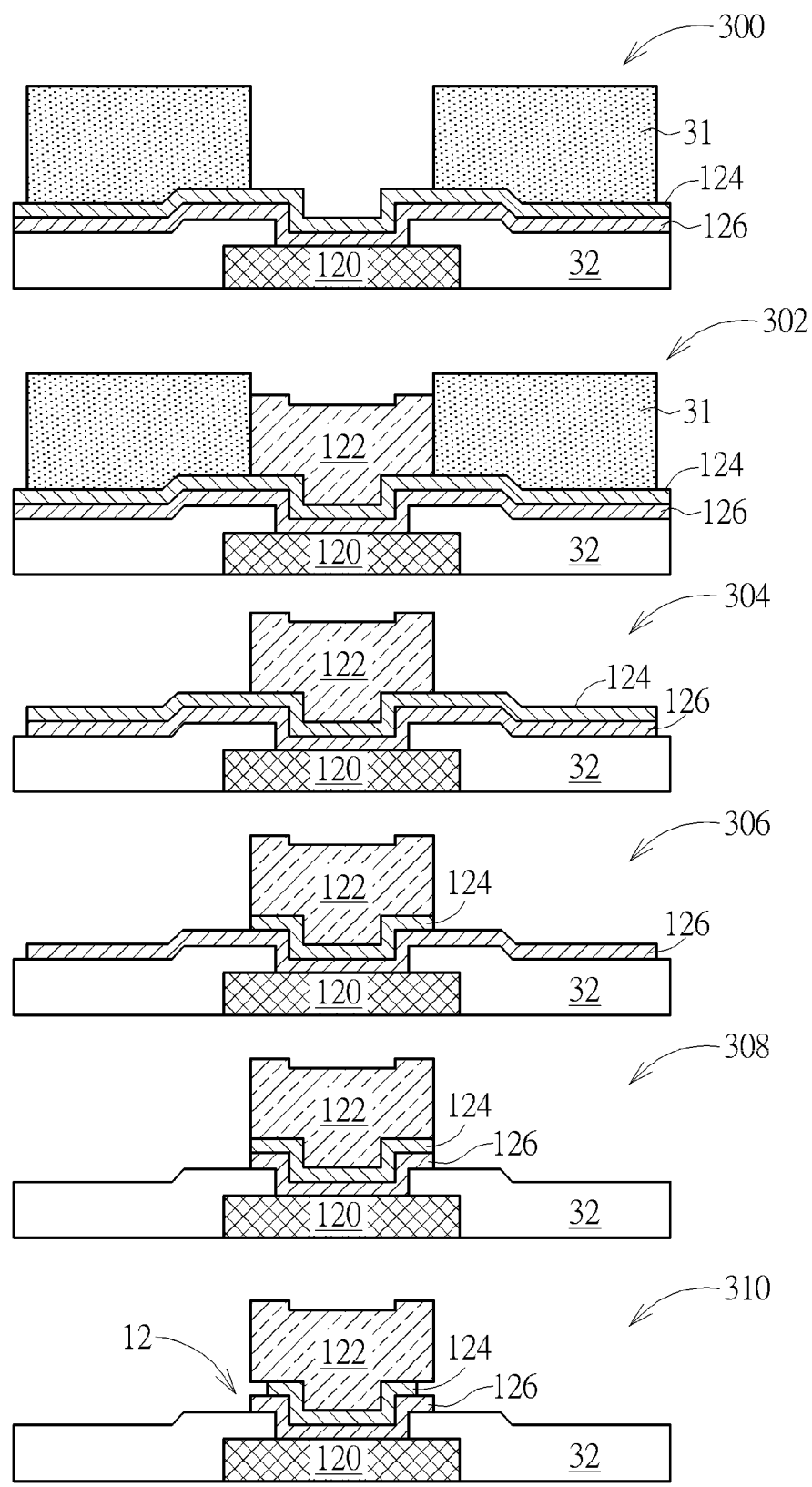
FIG. 3A illustrates a flowchart for the electronic element shown in FIG. 1A to generate the breach structure.

Furthermore, the embodiment of the invention can process an etching operation to generate the breach structure. In other words, the embodiment of the invention may process a structural destroying operation to the UBM layer next to the bump (or the bump connecting base), to form the breach structure at a plane where the bump attaches onto the UBM layer. Please refer to FIG. 3A, which illustrates a flowchart for the electronic element 12 shown in FIG. 1A to generate the breach structure. As shown in FIG. 3A, the bump 122 and the UBM layers 124, 126 of the electronic element 12 are processed by a serial operation to be formed onto the substrate 120 from step 300 to step 308. For example, step 300 generates the UBM layers 124, 126 onto the substrate 120 by configuring a photo resist layer 31 and a passivation layer 32; step 302 processes a plating operation to generate the bump 122; step 304 to step 308 process a serial etching/detaching operation to correspondingly form the bump 122 and the UBM layers 124, 126, so as to implement a predetermined specification of the electronic element 12.

Besides, in order to enhance the shear-force resistance of the electronic element 12, step 310 processes the etching operation onto the UBM layer 124 next to the substrate 122, to correspondingly generate the breach structure. Preferably, the etching operation of the embodiment may process an ion exchanging/chemical reaction/electron migration/wet etching/dried etching operation, to form the breach structure on the UBM layer 124 next to the bump 122. In comparison with the external structure of the UBM layer 124 shown in step 308, the etching operation in step 310 makes each side of the UBM layer 124 to retreat a distance at least 0.5 mm to 1 mm, such that the cross area of the UBM layer 124 is smaller than the cross areas of the bump 122 and the UBM layer 126 to correspondingly form the breach structure. Certainly, those skilled in the art may adaptively combine/replace the mentioned etching operations of the embodiment with other types of manufacturing operations to form the breach structure on the UBM layer next to the bump, which is also within the scope of the invention. Further, the breach structure is not limiting to be formed on the UBM layer 124 shown in FIG. 3A, and those skilled in the art may have the breach structure to be formed on the UBM layer 126 (not shown in the figure). In other words, step 310 may process the etching operation for the UBM layer 126 to correspondingly generate the breach structure on the UBM layer 126, and accordingly, the cross area projected by the UMB layer 126 (or the length/width corresponding to the projected area) is smaller than the cross area projected by the bump 122 or the UBM layer 124 (or the length/width corresponding to the projected area), which is also within the scope of the invention.

Figure 3B:
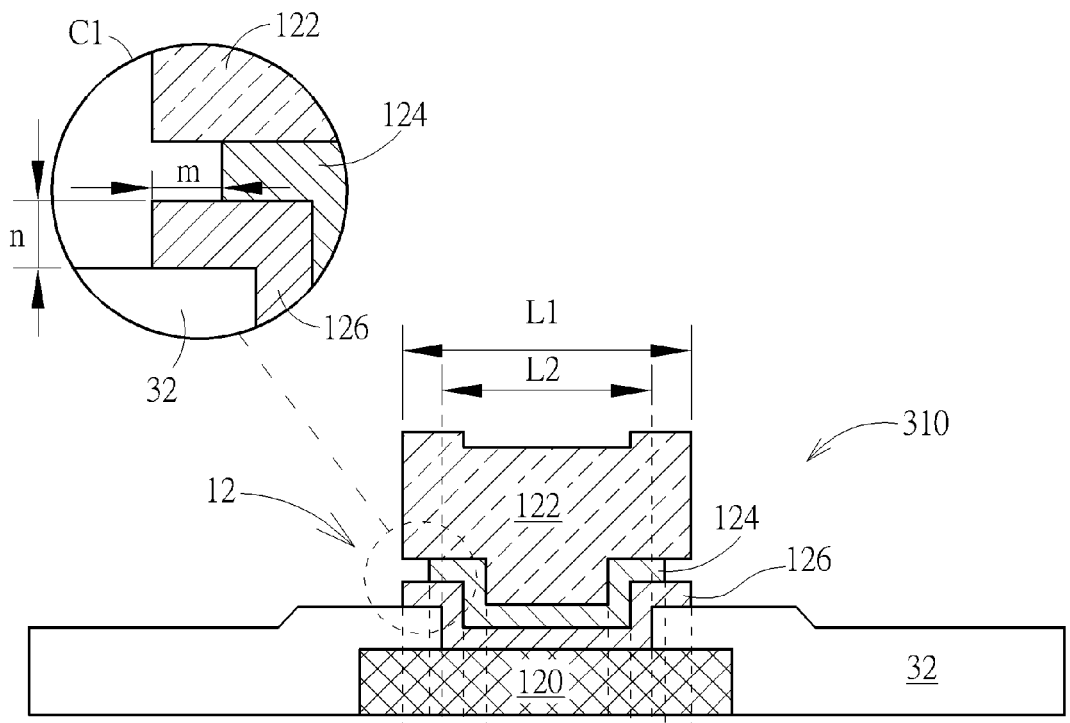
FIG. 3B illustrates a detailed schematic diagram of the electronic element after finishing step 310 shown in FIG. 3A.
Figure 3C:
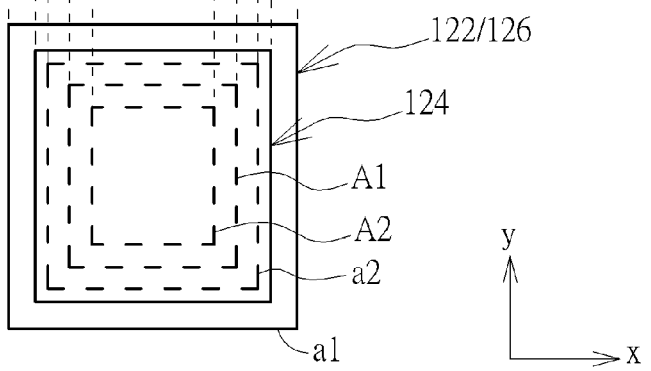
FIG. 3C illustrates a detailed schematic diagram of a vertical view of the electronic element after finishing step 310 shown in FIG. 3A.

Please refer to FIG. 3B and FIG. 3C, wherein FIG. 3B illustrates a detailed schematic diagram of the electronic element 12 after finishing step 310 shown in FIG. 3A, and FIG. 3C illustrates a detailed schematic diagram of a vertical view of the electronic element 12 after finishing step 310 shown in FIG. 3A. As shown in FIG. 3B, the bump 122 has a first length L1 (i.e. a longest length projected by the bump 122) along a x-axis and a first area a1 projected onto the place shown in FIG. 3C; the portion of the UBM layer 126 contacting/attaching the substrate 120 has a second length L2 (i.e. a length projected by the portion of the UBM layer 126 contacting/attaching the substrate 120) along the x-axis and a second area a2 projected onto the place shown in FIG. 3C. Accordingly, the embodiment of the invention defines an opening ratio as the second area a2 dividing the first area a1, and when the opening ratio equals 5% (or is smaller than 5%), the bump 122 can still be firmly fixed onto the substrate 120 (e.g. a driving chip). Besides, FIG. 3B further comprises a magnified figure C1, which further demonstrates a configuration of the bump 122, the UBM layers 124 and 126. Preferably, along the x-axis, the UBM layer 124 is shorter than the bump 122 (or the UBM layer 126) with a length m (i.e. a retreating length of the breach structure along the x-axis); along a y-axis, the UBM layer 126 comprises a thickness n. Accordingly, a preferable embodiment of the invention has the length m being equivalent to or larger than one fourth of the thickness n, and a better shear-force resistance of the bump can be anticipated, which is not limiting the scope of the invention. Further, the embodiment in FIG. 3C is similar to the vertical view embodiment shown in FIG. 2, and the only difference is that the embodiment shown in FIG. 3C further depicts a fillister structure of the electronic element 12. For example, the UBM layer 126 comprises a first fillister cross area A1, the UBM layer 124 comprises a second fillister cross area A2, and the embodiment shown in FIG. 3C also inherits the same realization shown in FIG. 2, i.e. the second fillister cross area A2 is covered/overlapped/surrounded by the first fillister cross area A1. Under such circumstances, in comparison with the cross area (or the length/width) of the bump 122 or the UBM layer 126, the cross area (or the fillister cross area, the length/width of the cross area) of the UBM layer 124 is the smallest, which correspondingly provides the best shear-force resistance for the bump.

Figure 4:
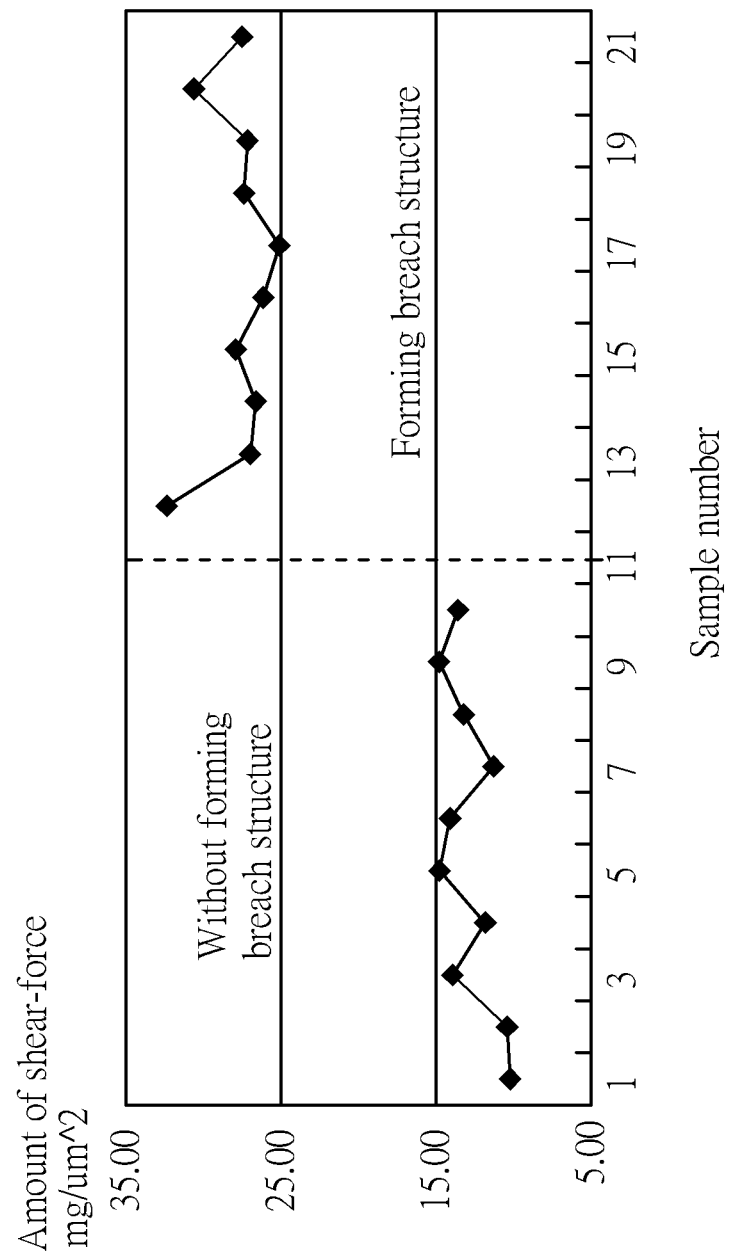
FIG. 4 illustrates a schematic diagram of a shear-force experimental comparison for an electronic element with or without generating the breach structure according to an embodiment of the invention.

Please refer to FIG. 4, which illustrates a schematic diagram of a shear-force experimental comparison for an electronic element with or without generating the breach structure according to an embodiment of the invention. As shown in FIG. 4, a first shear-force is obtained before the electronic element generates the breach structure and a second shear-force is obtained after the electronic element has generated the breach structure, and accordingly, the experimental result in FIG. 4 shows that the first shear-force is generally smaller than the second shear-force. In other words, the embodiment of the invention may demonstrate that the breach structure contributes the electronic element to resist external forces with the stronger shear-force resistance and the bump may not be easy to detach from the substrate.

Figure 5:
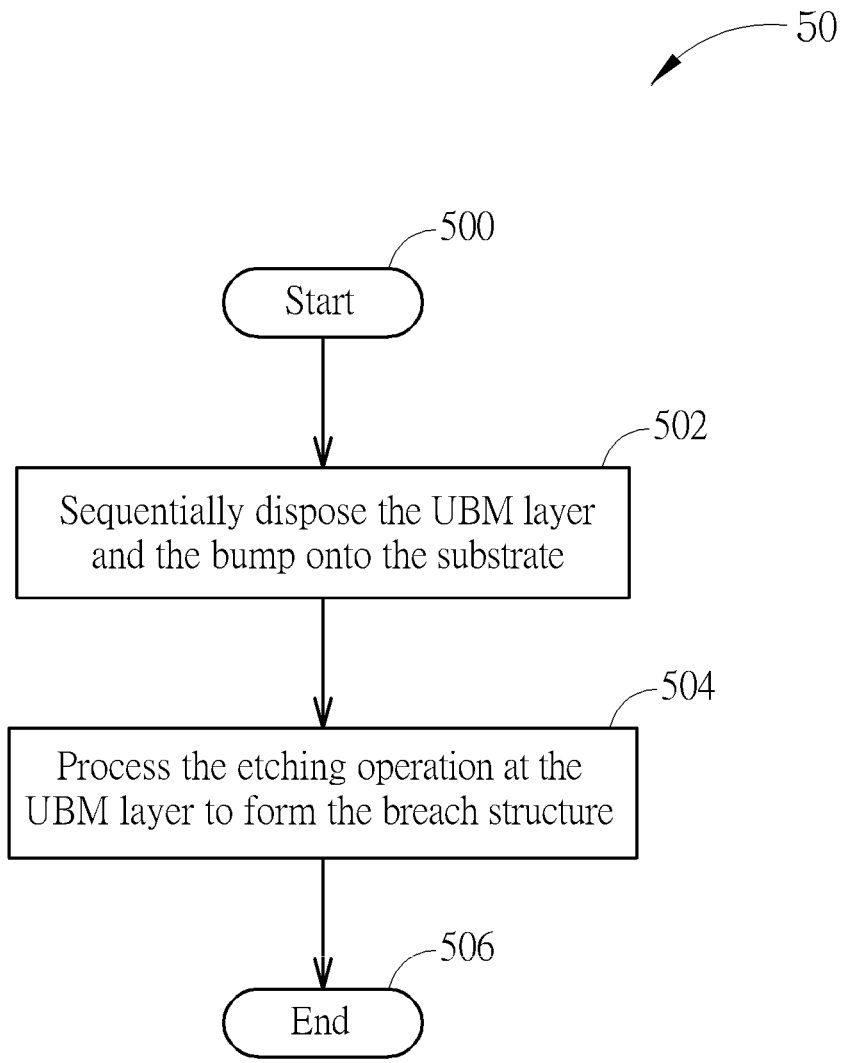
FIG. 5 illustrates a flowchart of a manufacturing process according to an embodiment of the invention.

Further, related operations for manufacturing the electronic element can be summarized as a manufacturing process 50, as shown in FIG. 5, to be complied as a programming code stored in a storage device of a manufacturing apparatus, so as to form the breach structure on the electronic element for improving its shear-force resistance. The manufacturing process 50 includes the steps as follows.

Step 500: Start.

Step 502: Sequentially dispose the UBM layer and the bump onto the substrate.

Step 504: Process the etching operation at the UBM layer to form the breach structure.

Step 506: End.

In short, according to manufacturing processes of different electronic apparatuses/elements, the manufacturing process 50 of the embodiment may be adaptively stored in the storage device of different types of manufacturing apparatuses. Further, after step 502 finishes its operations (or some complex operations for manufacturing different electronic apparatuses/elements are finished), step 504 processes the etching operation to correspondingly form the breach structure on the UBM layer next to the bump (or the bump connecting base), so as to enhance the shear-force resistance of the bump. Accordingly, the electronic element with the breach structure can have a higher yield rate for processing cutting, grinding, packing operations, to correspondingly prevent the bump from detaching from the substrate (or the driving chip). Also, considering the approach as narrowing down the driving chip, the embodiment of the invention provides a more flexible layout design to accommodate/configure more elements/lines on the same substrate. For controlling sizes of the breach structure, another operational interface may be adaptively utilized to set/predetermine an operational period, so as to correspondingly control how long the etching operation is processed before initiating step 504, which is also within the scope of the invention.

Certainly, due to different requirements of the electronic apparatus/element, the material and the configuration number of the UBM layer may be adaptively adjusted, such that the plurality of UBM layers between the bump and the substrate form a stairway structure, and the breach structure is disposed at the at least one UBM layer next to the bump, so as to form the smallest cross area of the UBM layer next to the bump. The cross area of the other UBM layers or the bump may also be adaptively adjusted according to different types of the electronic apparatus/element, which is not limiting the scope of the invention.

To sum up, the embodiments of the invention provide an electronic element and manufacturing method thereof, to correspondingly form a breach structure on the UBM layer next to the bump, so as to improve the shear-force resistance of the bump, such that the cost for processing cutting, grinding, packing operations of the electronic element may be adaptively reduced, and a higher yield rate of the electronic element may also be anticipated.

Those skilled in the art will readily observe that numerous modifications and alterations of the device and method may be made while retaining the teachings of the invention. Accordingly, the above disclosure should be construed as limited only by the metes and bounds of the appended claims.

What is claimed is:

1. A manufacturing method for an electronic element of an electronic apparatus, the electronic element comprising a substrate, a bump and at least one under bump metal (UBM) layer, the manufacturing method comprising:
   sequentially disposing the UBM layer and the bump onto the substrate; and
   processing an etching operation at an outer periphery of the UBM layer to form a breach structure in a form of an air groove between the substrate and the bump, wherein the etching operation processes a structural destroying operation for the UBM layer, to form the breach structure at a plane where the bump attaches onto the UBM layer.

2. A manufacturing method for an electronic element of an electronic apparatus, the electronic element comprising a substrate, a bump and at least one under bump metal (UBM) layer, the manufacturing method comprising:
   sequentially disposing the UBM layer and the bump onto the substrate; and
   processing an etching operation at an outer periphery of the UBM layer to form a breach structure in a form of an air groove between the substrate and the bump, wherein when a material of the bump and a material of the UBM layer are the same, the UBM layer is regarded as a part of the bump, or when the material of the bump and the material of the UBM layer are not the same, the bump and the UBM layer are stacked to be a metallic bonding body.

3. A manufacturing method for an electronic element of an electronic apparatus, the electronic element comprising a substrate, a bump and at least one under bump metal (UBM) layer, the manufacturing method comprising:
   sequentially disposing the UBM layer and the bump onto the substrate; and
   processing an etching operation at an outer periphery of the UBM layer to form a breach structure in a form of an air groove between the substrate and the bump, wherein the breach structure is disposed at a plane where the bump attaches onto the UBM layer, and from a vertical view, a first cross area projected by the bump is larger than a second cross area projected by the UBM layer.

4. The manufacturing method of claim 3, further comprising forming another UBM layer disposed between the UBM layer and the substrate, and from a vertical view, a third cross area projected by the another UBM layer is larger than a second cross area projected by the UBM layer.

5. The manufacturing method of claim 4, wherein the UBM layer and the another UBM layer are stacked as a stairway structure.

* * * * *